(12) United States Patent
Liu et al.

(10) Patent No.: US 7,432,747 B1
(45) Date of Patent: Oct. 7, 2008

(54) GATE DRIVING CIRCUIT

(75) Inventors: Yao Yi Liu, Hsinchu (TW); Yen-An Chang, Hsinchu (TW)

(73) Assignee: Etron Technology Inc., Hsinchu (TW)

( * ) Notice: Subject to any disclaimer, the term of this patent is extended or adjusted under 35 U.S.C. 154(b) by 26 days.

(21) Appl. No.: 11/730,754

(22) Filed: Apr. 4, 2007

(51) Int. Cl.
*H03B 1/00* (2006.01)

(52) U.S. Cl. .................. 327/108; 327/112; 327/331; 326/82

(58) Field of Classification Search ............. 327/108, 327/109, 112, 309–311, 313, 327, 328, 331; 326/82–87
See application file for complete search history.

(56) References Cited

U.S. PATENT DOCUMENTS 4,410,815 A * 10/1983 Ransom et al. ............. 326/69
4,999,586 A * 3/1991 Meyer et al. ............... 330/288

* cited by examiner

*Primary Examiner*—N. Drew Richards
*Assistant Examiner*—An T. Luu
(74) *Attorney, Agent, or Firm*—Rosenberg, Klein & Lee

(57) ABSTRACT

The present invention relates to a gate driving circuit, comprising a driver control circuit, a voltage following bias circuit, a pull up circuit and a MOS transistor. The driver control circuit receives an active signal and generates a pull up signal or a pull down signal. In case of the pull up signal, the MOS transistor is turned to the OFF state by the pull up circuit, and there is no current for the output load device. In case of the pull down signal, the MOS transistor is turned to the ON state by the voltage following bias circuit. The driving voltage for the gate of the MOS transistor has a constant voltage drop according to the external supply voltage. Therefore, the gate driving circuit of the present invention provides a constant current for the output load device.

16 Claims, 6 Drawing Sheets

GATE DRIVING CIRCUIT

FIELD OF THE INVENTION

The present invention relates to a gate driving circuit, more particularly to a gate driving circuit that can provide a constant current for the output load device.

BACKGROUND OF THE INVENTION

In general, there would be a current source control device between the current source and an output load device. The current source control device, such as a MOS transistor, always needs a gate driving circuit for providing driving voltages to control the ON/OFF state of the current source control device. The current source control device provides a driving current for the output load device when it is in the ON state.

Referring to FIG. 1, there is shown a circuit diagram of a conventional gate driving circuit of the prior art. As shown in the figure, the gate driving circuit 10 comprises a driver control circuit 11, a pull up circuit 13, a pull down circuit 15 and a PMOS transistor 17.

When the driver control circuit 11 receives an active signal, it generates a pull up signal or a pull down sign in response to the active signal. If the driver control circuit 11 generates a pull up signal according to the active signal, the pull up circuit 13 will be enabled and output a pull up voltage to the gate of the PMOS transistor 17. If the driver control circuit 11 generates a pull down signal according to the active signal, the pull down circuit 15 will be enabled and output a pull down voltage to the gate of the PMOS transistor 17.

When the pull up circuit 13 is enabled, the gate voltage $V_G$ of the PMOS transistor 17 will be pulled up to the external supply voltage $V_{DD}$. In this case, the voltage difference between the source and the gate ($V_{SG}$) is smaller than the threshold voltage ($V_T$) of the PMOS transistor 17, and the PMOS transistor 17 will be turned to the OFF state. There would be no current for the output load device 19.

If the pull down circuit 15 is enabled, the gate voltage $V_G$ of the PMOS transistor 17 will be pulled down to the ground voltage. The voltage difference between the source and the gate ($V_{SG}$) is larger than the threshold voltage ($V_T$) of the PMOS transistor 17, and the PMOS transistor 17 is turned to the ON state. Then it provides a driving current for the output load device 19.

The conventional gate driving circuit 10 of the prior art has a drawback of causing an unstable driving current if the external supply voltage $V_{DD}$ varies or has a voltage drift. While the PMOS transistor 17 is in the ON state, the gate voltage $V_G$ is equal to the ground voltage and the source voltage is equal to the external supply voltage $V_{DD}$. In this case, if the external supply voltage $V_{DD}$ varies, the voltage source-to-gate ($V_{SG}$) varies too, thus the current that passes through the PMOS transistor 17 also varies.

The current instability caused by the conventional gate driving circuit 10 is usually harmful for the output load device 19 and other load devices. It may drive the load devices to the unstable state or cause damages to the load devices.

SUMMARY OF THE INVENTION

Accordingly, the object of the present invention is to design a gate driving circuit to overcome the shortcomings of the prior art.

It is a primary object of the present invention to provide a gate driving circuit, comprising a voltage following bias circuit which makes the gate voltage of the PMOS transistor a constant voltage drop of the external supply voltage in the ON state, therefore the voltage source-to-gate of the PMOS transistor will be constant in the ON state.

It is a secondary object of the present invention to provide a gate driving circuit which keeps the voltage source-to-gate of the PMOS transistor a constant in the ON state, so that a constant current is providing for the output load device.

It is another object of the present invention to provide a gate driving circuit, further comprising a pull down circuit for quickly pulling the gate voltage down to the target value of the voltage following bias circuit.

To achieve the previous mentioned and other objects, the present invention provides a gate driving circuit, comprising: a driver control circuit for receiving an active signal, and generating a pull up signal and a pull down signal in response to said active signal; a pull up circuit connected to said driver control circuit through a first signal line, and connected to an external supply voltage for providing a pull up voltage in response to said pull up signal; a MOS transistor with the source connected to said external supply voltage, the gate connected to said pull up circuit, and the drain connected to an output load device; and a voltage following bias circuit connected to said driver control circuit through a second signal line, and connected to said external supply voltage and said gate of said MOS transistor for generating a gate driving voltage in response to said pull down signal.

DETAILED DESCRIPTION OF THE PREFERRED EMBODIMENT

Figure 1:
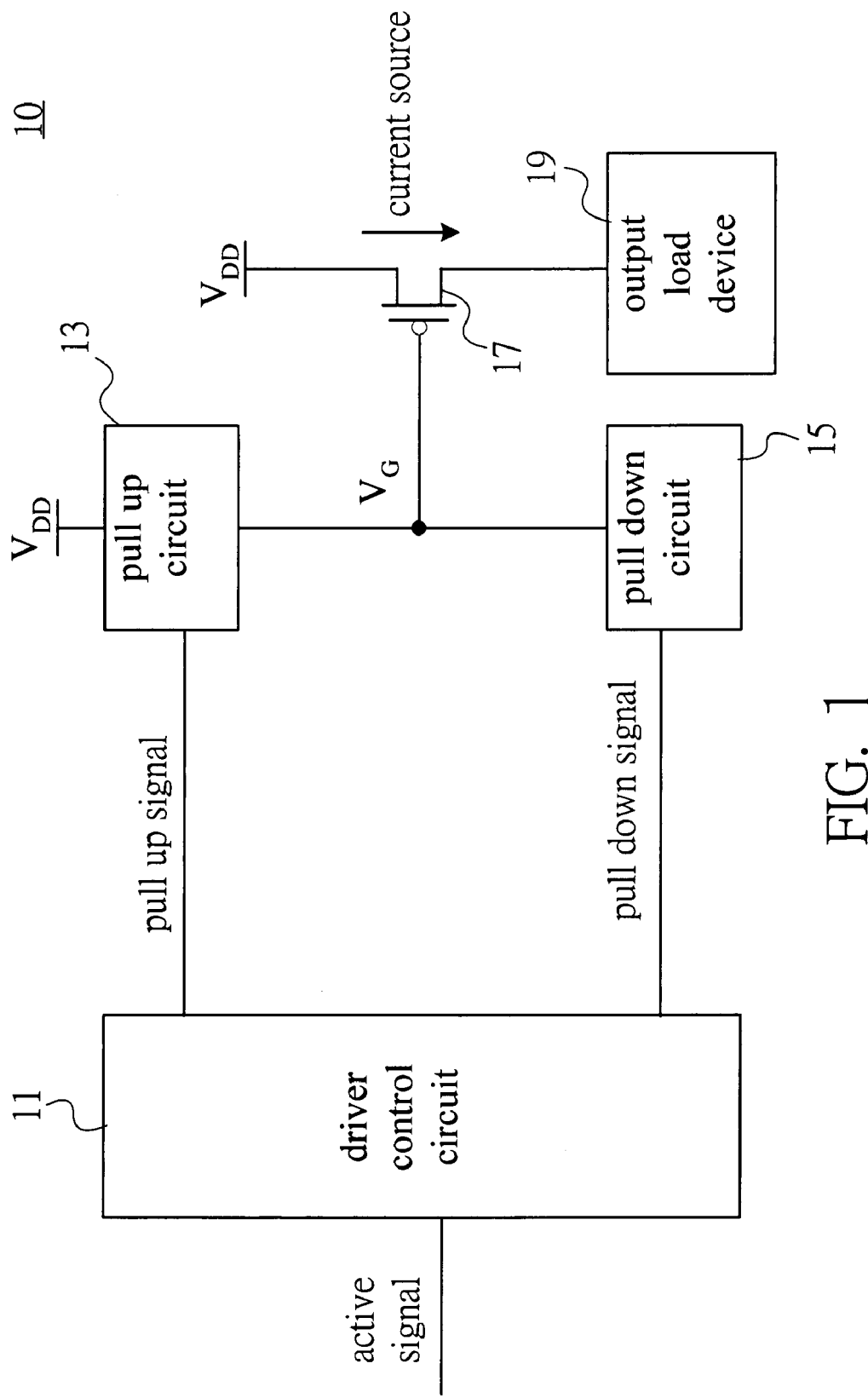
FIG. 1 is a block diagram of a conventional gate driving circuit of the prior art.
Figure 2:
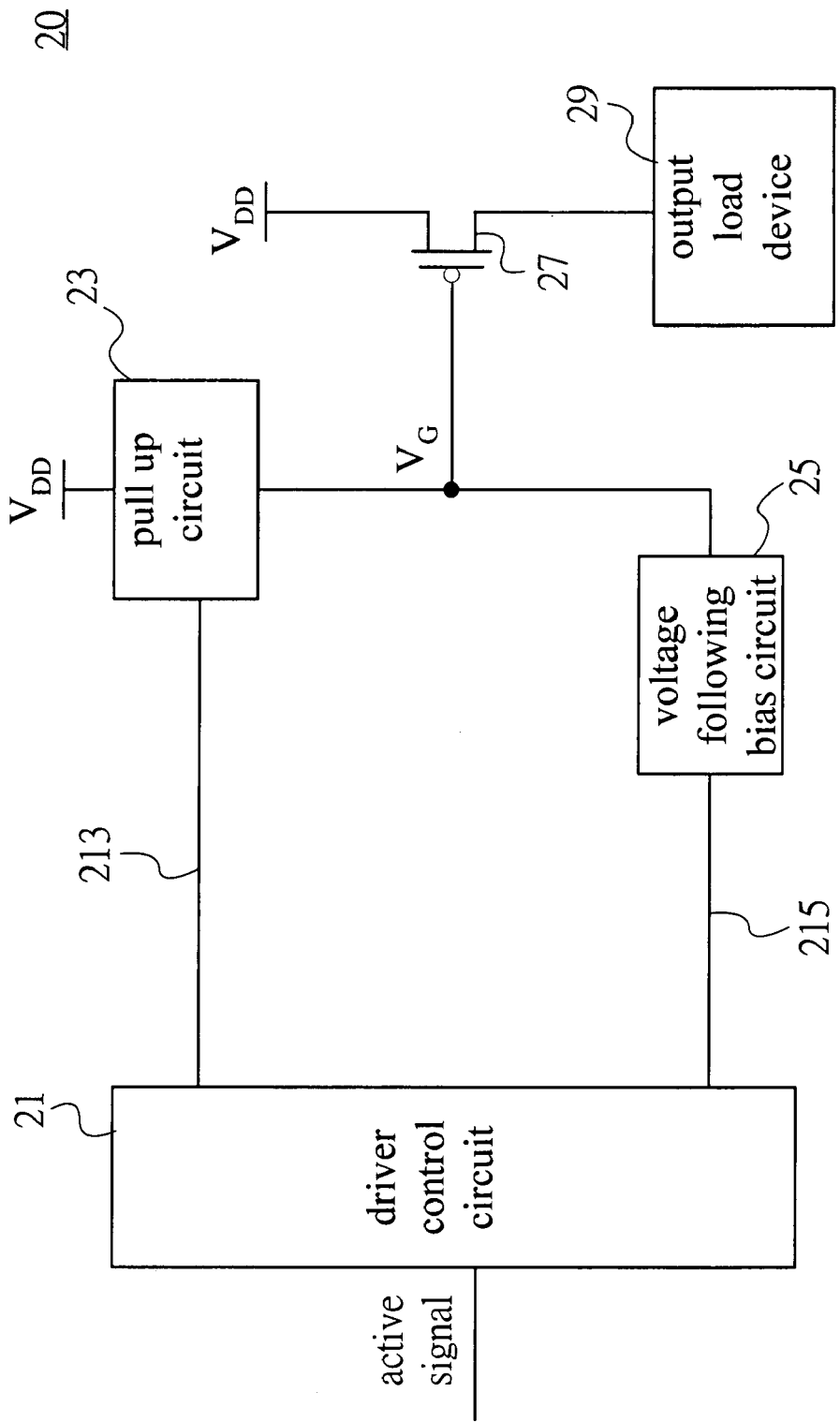
FIG. 2 is a block diagram of a preferred embodiment of the present invention.

Referring to FIG. 2, there is shown a block diagram of a preferred embodiment of the present invention. As shown in the figure, the gate driving circuit 20 comprises a driver control circuit 21, a pull up circuit 23, a voltage following bias circuit 25, and a MOS transistor 27.

The pull up circuit 23 is connected to the driver control circuit 21 through the first signal line 213. The voltage following bias circuit 25 is connected to the driver control circuit 21 through the second signal line 215. The pull up circuit 23 and the voltage following bias circuit 25 are both connected to the gate of the MOS transistor 27 for driving the MOS transistor 27 to the ON state or the OFF state.

In the present embodiment, the MOS transistor 27 is a PMOS transistor with the source connected to the external supply voltage $V_{DD}$ and the drain connected to the output load device 29.

The driver control circuit 21 generates a pull up signal or a pull down signal according to an active signal. If the driver control circuit 21 generates a pull up signal according to the active signal, the pull up signal will be transmitted to the voltage following bias circuit 25 firstly to disable the voltage following bias circuit 25, and will be transmitted to the pull up circuit 23 after a delay time to enable the pull up circuit 23. If the driver control circuit 21 generates a pull down signal according to the active signal, then the pull down signal will be transmitted to the pull up circuit 23 firstly to disable the pull up circuit 23, and will be transmitted to the voltage following bias circuit 25 after a delay time to enable the voltage following bias circuit 25.

When the pull up circuit 23 is enabled, the gate voltage $V_G$ of the PMOS transistor 27 is pulled up to the external supply voltage $V_{DD}$. Since the source voltage ($V_S$) is equal to the external supply voltage $V_{DD}$, the voltage source-to-gate ($V_{SG}$) is smaller than the threshold voltage ($V_T$) of the PMOS transistor 27. Therefore the PMOS transistor 27 is turned to the OFF state, and there would be no current for the output load device 29.

When the voltage following bias circuit 25 is enabled, it generates a driving voltage with a constant voltage drop according to the external supply voltage $V_{DD}$, and pulls down the gate voltage $V_G$ to the driving voltage. In order to drive the PMOS transistor 27 to have a state transition, the voltage drop is always set greater than the threshold voltage ($V_T$) of the PMOS transistor 27. Since the gate voltage $V_G$ is the constant voltage drop of the external supply voltage $V_{DD}$, the voltage source-to-gate ($V_{SG}$) is greater than the threshold voltage ($V_T$). Therefore the PMOS transistor 27 is turned to the ON state, and a driving current is provided for the output load device 29.

Furthermore, the gate voltage $V_G$ of the PMOS transistor 27 is always controlled to be the constant voltage drop of the external supply voltage $V_{DD}$ by the voltage following bias circuit 25 even though the external supply voltage $V_{DD}$ varies. Then the voltage source-to-gate $V_{SG}$ is guaranteed to be the constant, and the driving current for the output load device 29 passing through the PMOS transistor 27 will be constant also.

Figure 3:
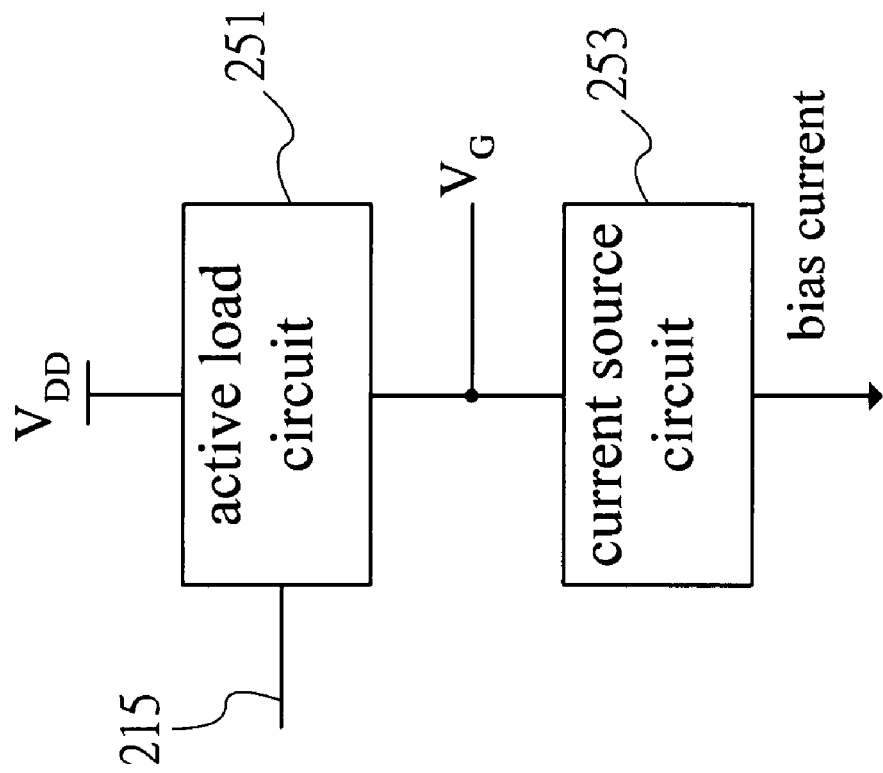
FIG. 3 is a block diagram of the voltage following bias circuit of a preferred embodiment of the present invention.

Referring to FIG. 3, there is shown a block diagram of the voltage following bias circuit of a preferred embodiment of the present invention. As shown in the figure, the voltage following bias circuit 25 comprises an active load circuit 251 and a current source circuit 253.

The active load circuit 251 is connected between the external supply voltage $V_{DD}$ and the current source circuit 253, and is connected to the driver control circuit 21 through the second signal line 215. When the active load circuit 251 receives a pull up signal from the driver control circuit 21, it will be disabled. There would be no current and voltage outputted. When the active load circuit 251 receives a pull down signal from the driver control circuit 21, it will be enabled. As a result of the operation of the current source circuit 253, there is a constant bias current passing through the active load circuit 251, and it causes a constant voltage drop between the two ends of the active load circuit 251. Since one end of active load circuit 251 is connected to the external supply voltage $V_{DD}$, the voltage of the other end of the current source circuit 253 is the constant voltage drop of the external supply voltage $V_{DD}$. Therefore, the voltage following bias circuit of the present embodiment can provide a driving voltage with a constant voltage drop according to the external supply voltage $V_{DD}$, even though the external supply voltage $V_{DD}$ varies.

Figure 4:
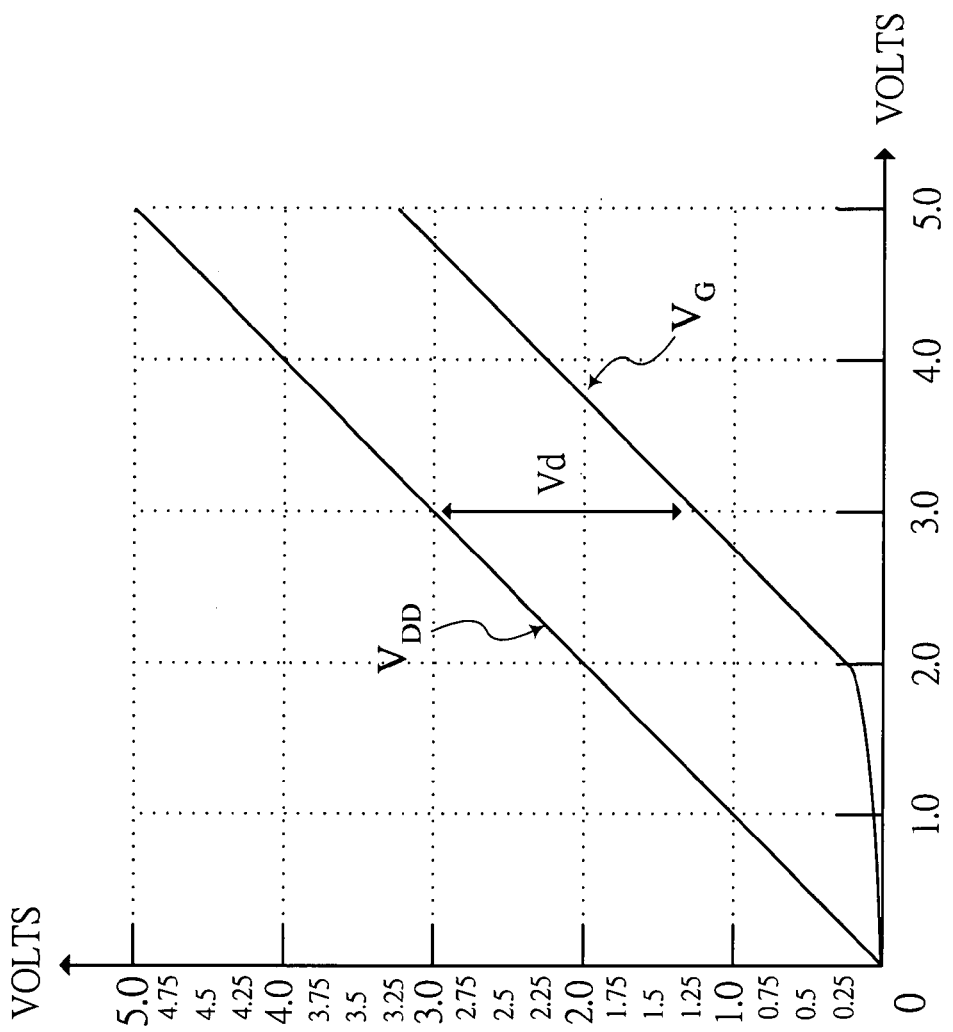
FIG. 4 is a diagram of the relationship between the external supply voltage and the gate voltage of the PMOS transistor.

Referring to FIG. 4, there is shown a diagram of the relationship between the external supply voltage and the gate voltage of the PMOS transistor, wherein the horizontal axis denotes the value of the external supply voltage $V_{DD}$, and the vertical axis denotes the value of the gate voltage $V_G$ of the PMOS transistor relating to the external supply voltage $V_{DD}$. As shown in the figure, if the external supply voltage $V_{DD}$ increases, the gate voltage $V_G$ increases, too. In this case, the voltage difference Vd between the external supply voltage $V_{DD}$ and the gate voltage $V_G$ is set approximately 1.75 volts for the requirement of the circuit, and is greater than the threshold voltage ($V_T$) of the MOS transistor 27. As shown in the figure, the voltage following bias circuit works well when the external supply voltage is greater than 2.0 volts. While the external supply voltage $V_{DD}$ is greater than 2.0 volts, the voltage difference Vd is equal to the voltage source-to-gate ($V_{SG}$) of the PMOS transistor 27 in the FIG. 2, and always keeps constant, so that the current passing through the PMOS transistor 27 is always constant, too.

Figure 5:
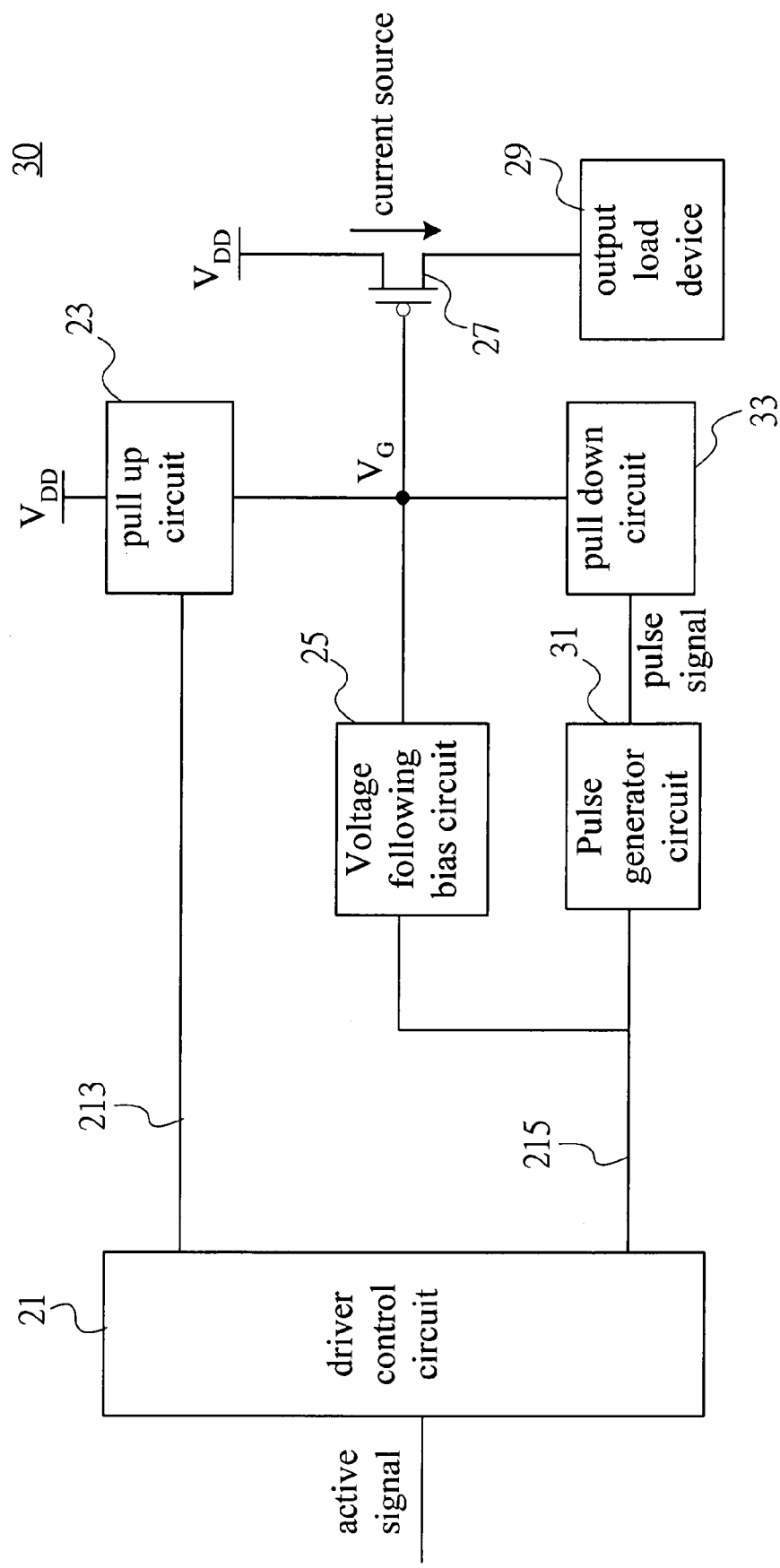
FIG. 5 is a block diagram of another preferred embodiment of the present invention.

Referring to FIG. 5, there is shown a block diagram of another preferred embodiment of the present invention. As shown in the figure, the gate driving circuit 30 is almost the same as the embodiment shown in the FIG. 2, but further comprises a pull down circuit 33 and a pulse generator circuit 31.

The pulse generator circuit 31 is connected between the second signal line 215 and the pull down circuit 33, and the pull down circuit 33 is connected to the gate of the PMOS transistor 27.

If the driver control circuit 21 generates a pull up signal according to the active signal, the pull up signal will be transmitted to the voltage following bias circuit 25 and the pulse generator circuit 31 firstly to disable the voltage following bias circuit 25 and the pulse generator circuit 31, and will be transmitted to the pull up circuit 23 after a delay time to enable the pull up circuit 23. If the driver control circuit 21 generates a pull down signal according to the active signal, then the pull down signal will be transmitted to the pull up circuit 23 firstly to disable the pull up circuit 23, and will be transmitted to the voltage following bias circuit 25 and the pulse generator circuit 31 after a delay time to enable the voltage following bias circuit 25 and the pulse generator circuit 31.

When the pulse generator circuit 31 is enabled, it generates a pulse signal to enable the pull down circuit 33 for a short time interval. Then the pull down circuit 33 can help to pull down the gate voltage $V_G$ of the PMOS transistor 27 rapidly to the target voltage of the voltage following bias circuit 25.

Figure 6:
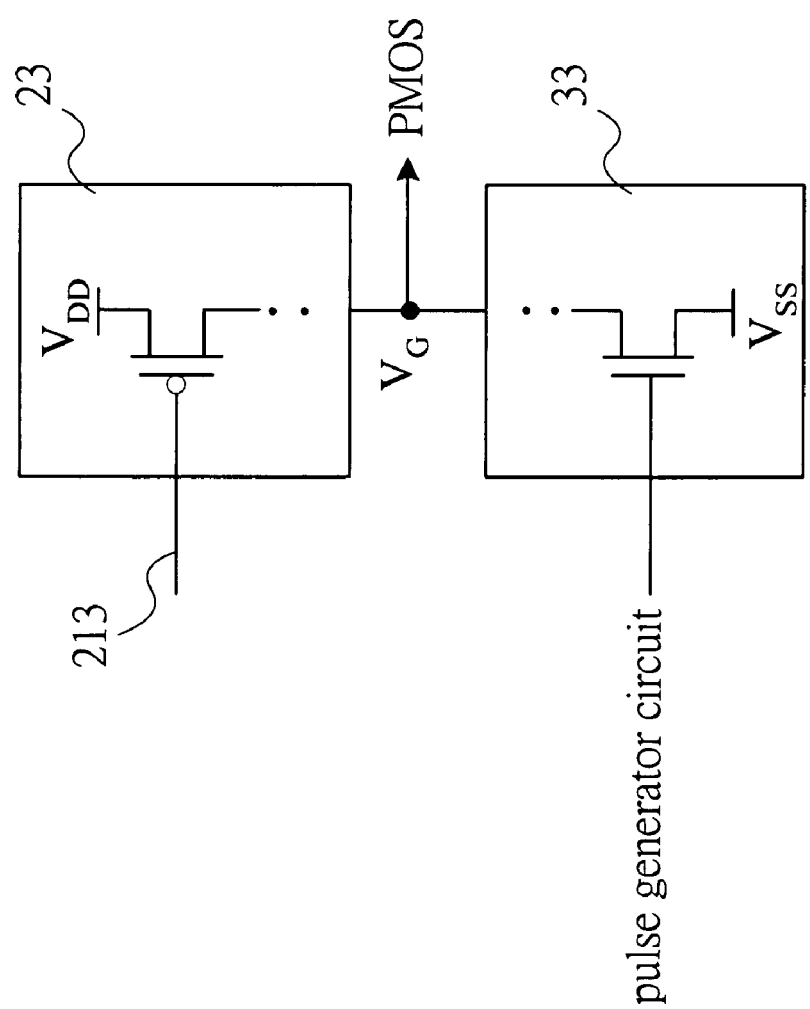
FIG. 6 is a circuit diagram of the pull up circuit and the pull down circuit of a preferred embodiment of the present invention.

Referring to FIG. 6, there is shown a circuit diagram of the pull up circuit and the pull down circuit of a preferred embodiment of the present invention. As shown in the figure, the pull up circuit 23 of the present embodiment comprises at least one PMOS transistor, and the gate of each PMOS transistor is connected to the first signal line 213 respectively. The pull down circuit 33 of the present embodiment comprises at least one NMOS transistor, and the gate of each NMOS transistor is connected to the pulse generator circuit (31) respectively. The pull up circuit 23 and the pull down circuit 33 are connected to the gate of the PMOS transistor (27) for pulling up or pulling down the gate voltage.

The present invention is not limited to the above-described embodiments. Various alternatives, modifications and equivalents may be used. Therefore, the above embodiments should not be taken as limiting the scope of the invention, which is defined by the appending claims.

What is claimed is:

1. A gate driving circuit, comprising:
   a driver control circuit for receiving an active signal, and generating a pull up signal and a pull down signal in response to said active signal;
   a pull up circuit connected to said driver control circuit through a first signal line, and connected to an external supply voltage for providing a pull up voltage in response to said pull up signal;

a MOS transistor with the source connected to said external supply voltage, the gate connected to said pull up circuit, and the drain connected to an output load device; and a voltage following bias circuit connected to said driver control circuit through a second signal line, and connected to said external supply voltage and said gate of said MOS transistor for generating a gate driving voltage in response to said pull down signal.

2. The gate driving circuit of claim 1, wherein said gate driving voltage has a constant voltage drop according to said external supply voltage.

3. The gate driving circuit of claim 2, wherein said constant voltage drop is greater than the threshold voltage of the MOS transistor.

4. The gate driving circuit of claim 3, further comprising:
a pulse generator circuit connected to said driver control circuit for generating a pulse signal in response to said pull down signal; and
a pull down circuit connected to said pulse generator circuit and said gate for pulling down the voltage of said gate in response to said pulse signal.

5. The gate driving circuit of claim 3, wherein said pull up signal is transmitted by said first signal line and said second signal line with a delay time.

6. The gate driving circuit of claim 3, wherein said pull down signal is transmitted by said first signal line and said second signal line with a delay time.

7. The gate driving circuit of claim 3, wherein said MOS transistor is a PMOS transistor.

8. The gate driving circuit of claim 3, wherein said voltage following bias circuit comprises:

a current source circuit for generating a bias current; and
an active load circuit connected to said driver control circuit, said external supply voltage, and said current source circuit for generating said driving voltage according to said external supply voltage in response to said pull down signal.

9. The gate driving circuit of claim 3, wherein said pull up circuit comprises at least one PMOS transistor.

10. The gate driving circuit of claim 3, wherein the pull down circuit comprises at least one NMOS transistor.

11. The gate driving circuit of claim 4, wherein said pull up signal is transmitted by said first signal line and said second signal line with a delay time between them.

12. The gate driving circuit of claim 4, wherein said pull down signal is transmitted by said first signal line and said second signal line with a delay time between them.

13. The gate driving circuit of claim 4, wherein said MOS transistor is a PMOS transistor.

14. The gate driving circuit of claim 4, wherein said voltage following bias circuit comprises:
a current source circuit for generating a bias current; and
an active load circuit connected to said driver control circuit, said external supply voltage, and said current source circuit for generating said driving voltage according to said external supply voltage in response to said pull down signal.

15. The gate driving circuit of claim 4, wherein said pull up circuit comprises at least one PMOS transistor.

16. The gate driving circuit of claim 4, wherein said pull down circuit comprises at least one NMOS transistor.

* * * * *